United States Patent
Yu et al.

(10) Patent No.: US 9,871,018 B2
(45) Date of Patent: Jan. 16, 2018

(54) PACKAGED SEMICONDUCTOR DEVICES AND METHODS OF PACKAGING SEMICONDUCTOR DEVICES

(71) Applicant: Taiwan Semiconductor Manufacturing Company, Ltd., Hsin-Chu (TW)

(72) Inventors: Chen-Hua Yu, Hsin-Chu (TW); Chung-Shi Liu, Hsin-Chu (TW); Chih-Fan Huang, Kaoshung (TW); Hui-Min Huang, Taoyuan (TW); Wei-Hung Lin, Xinfeng Township (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/062,757

(22) Filed: Mar. 7, 2016

(65) Prior Publication Data
US 2016/0190096 A1   Jun. 30, 2016

Related U.S. Application Data

(62) Division of application No. 14/182,574, filed on Feb. 18, 2014, now Pat. No. 9,299,688.
(Continued)

(51) Int. Cl.
*H01L 25/065* (2006.01)
*H01L 25/10* (2006.01)
(Continued)

(52) U.S. Cl.
CPC ........ *H01L 25/0652* (2013.01); *H01L 21/561* (2013.01); *H01L 21/565* (2013.01); *H01L 21/6835* (2013.01); *H01L 21/6836* (2013.01); *H01L 21/78* (2013.01); *H01L 23/04* (2013.01); *H01L 23/293* (2013.01);
(Continued)

(58) Field of Classification Search
CPC ......................... H01L 25/0652; H01L 21/565
See application file for complete search history.

(56) References Cited

U.S. PATENT DOCUMENTS

2010/0133704 A1*   6/2010   Marimuthu ........... H01L 21/565
                                                                    257/778
2013/0001776 A1    1/2013   Yu et al.
(Continued)

OTHER PUBLICATIONS

Chemical Abstracts Service, "CAS Information Use Policies (effective Apr. 16, 2012)," http://www.cas.org/legal/infopolicy#authorized, downloaded Jan. 7, 2014, 6 pages.
(Continued)

*Primary Examiner* — Marc Armand
(74) *Attorney, Agent, or Firm* — Slater Matsil, LLP

(57) ABSTRACT

Packaged semiconductor devices and methods of packaging semiconductor devices are disclosed. In some embodiments, a method of packaging a semiconductor device includes forming a mask coating over a carrier, coupling an integrated circuit die over the mask coating, and disposing a molding compound around the integrated circuit die. The method includes forming an interconnect structure over the integrated circuit die and the molding compound.

20 Claims, 13 Drawing Sheets

Related U.S. Application Data

(60) Provisional application No. 61/914,264, filed on Dec. 10, 2013.

(51) Int. Cl.

| | | |
|---|---|---|
| *H01L 21/56* | (2006.01) | |
| *H01L 21/78* | (2006.01) | |
| *H01L 23/538* | (2006.01) | |
| *H01L 23/00* | (2006.01) | |
| *H01L 21/683* | (2006.01) | |
| *H01L 23/04* | (2006.01) | |
| *H01L 23/29* | (2006.01) | |
| *H01L 23/31* | (2006.01) | |
| *H01L 23/367* | (2006.01) | |
| *H01L 23/528* | (2006.01) | |
| *H01L 23/498* | (2006.01) | |

(52) U.S. Cl.
CPC ...... *H01L 23/3135* (2013.01); *H01L 23/3142* (2013.01); *H01L 23/3675* (2013.01); *H01L 23/528* (2013.01); *H01L 23/5383* (2013.01); *H01L 23/5384* (2013.01); *H01L 23/5389* (2013.01); *H01L 24/17* (2013.01); *H01L 24/19* (2013.01); *H01L 24/97* (2013.01); *H01L 25/0657* (2013.01); *H01L 25/105* (2013.01); *H01L 23/3128* (2013.01); *H01L 23/49816* (2013.01); *H01L 24/73* (2013.01); *H01L 2221/68327* (2013.01); *H01L 2221/68372* (2013.01); *H01L 2224/0401* (2013.01); *H01L 2224/04105* (2013.01); *H01L 2224/12105* (2013.01); *H01L 2224/1302* (2013.01); *H01L 2224/16225* (2013.01); *H01L 2224/32225* (2013.01); *H01L 2224/32245* (2013.01); *H01L 2224/48091* (2013.01); *H01L 2224/48227* (2013.01); *H01L 2224/48465* (2013.01); *H01L 2224/73204* (2013.01); *H01L 2224/73265* (2013.01); *H01L 2224/73267* (2013.01); *H01L 2224/9222* (2013.01); *H01L 2224/92125* (2013.01); *H01L 2224/92244* (2013.01); *H01L 2224/97* (2013.01); *H01L 2225/06513* (2013.01); *H01L 2225/06517* (2013.01); *H01L 2225/06589* (2013.01); *H01L 2225/1035* (2013.01); *H01L 2225/1058* (2013.01); *H01L 2225/1094* (2013.01); *H01L 2924/12042* (2013.01); *H01L 2924/14* (2013.01); *H01L 2924/15311* (2013.01); *H01L 2924/181* (2013.01); *H01L 2924/18162* (2013.01)

(56) References Cited

U.S. PATENT DOCUMENTS

| | | | |
|---|---|---|---|
| 2014/0183761 A1 | 7/2014 | Lin et al. | |
| 2014/0252646 A1* | 9/2014 | Hung | H01L 23/481 257/774 |
| 2014/0299999 A1 | 10/2014 | Hu et al. | |
| 2015/0061079 A1 | 3/2015 | Chen et al. | |

OTHER PUBLICATIONS

Wikipedia, "CAS Registry Number," http://en.wikipedia.org/wiki/CAS_registry_number, downloaded Jan. 7, 2014, 4 pages.

Wikipedia, "(Hydroxyethyl)methacrylate," http://en.wikipedia.org/wiki/(Hydroxyethyl)methacrylate, downloaded Jan. 7, 2014, 2 pages.

\* cited by examiner

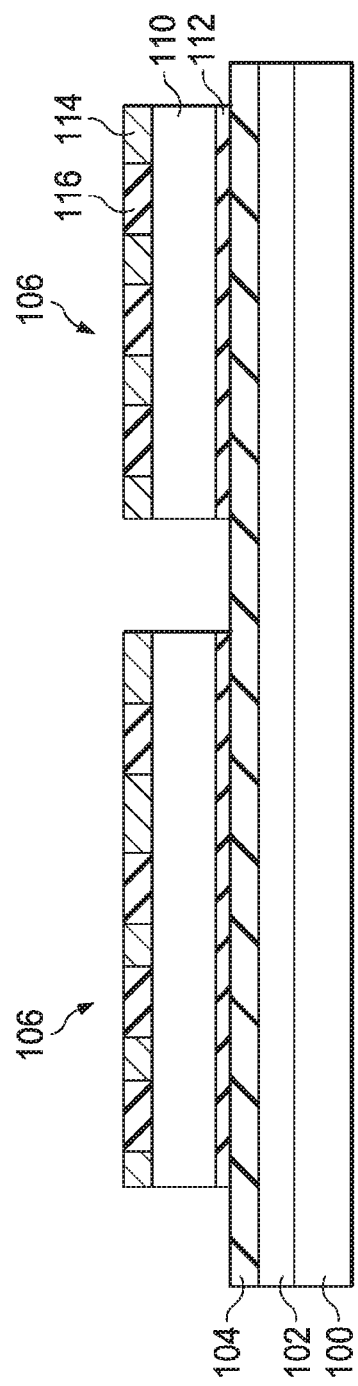
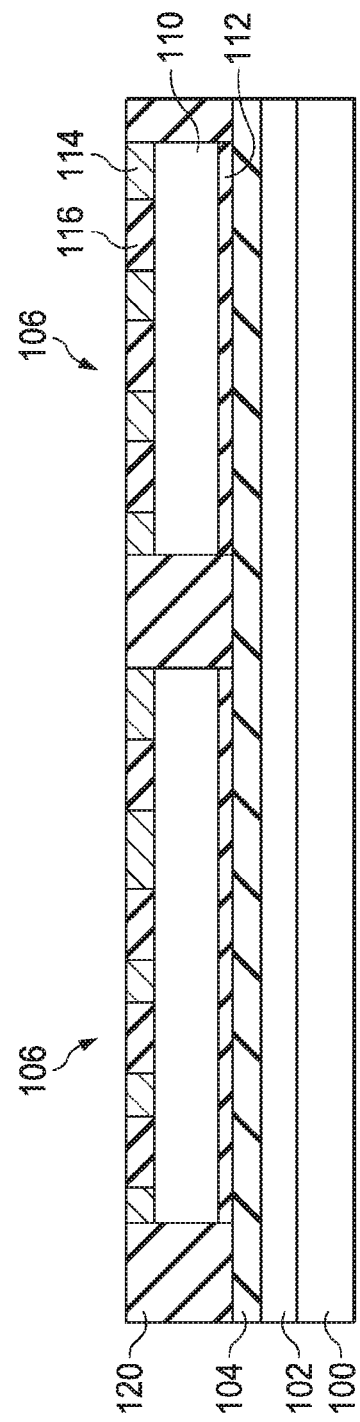
FIG. 3
FIG. 4

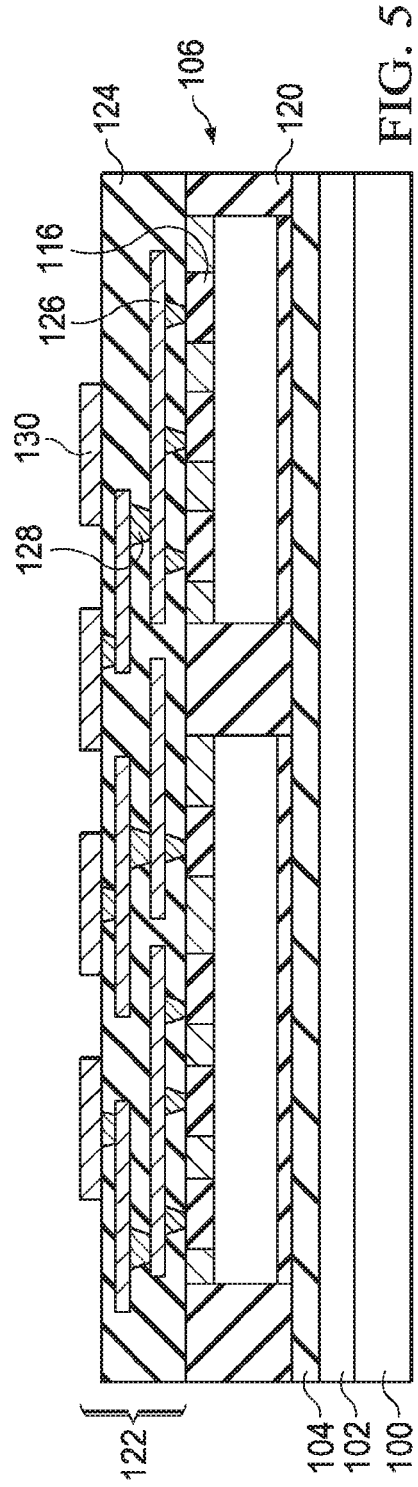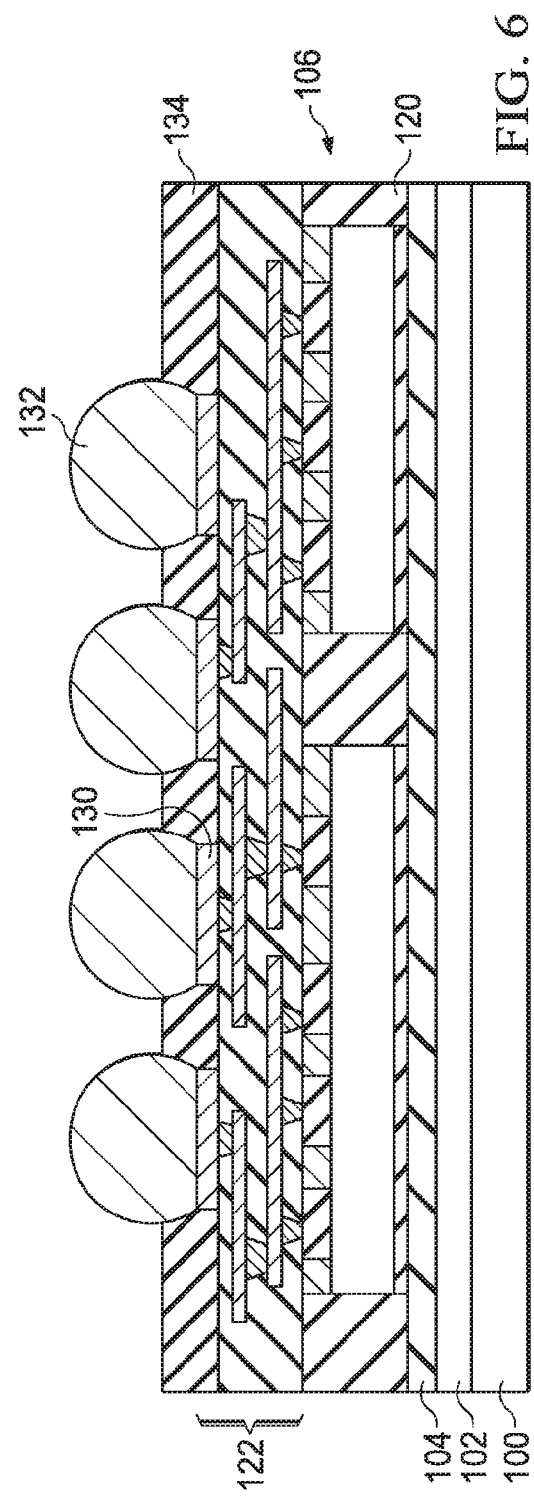

PACKAGED SEMICONDUCTOR DEVICES AND METHODS OF PACKAGING SEMICONDUCTOR DEVICES

PRIORITY CLAIM AND CROSS-REFERENCE

This application is a divisional of U.S. patent application Ser. No. 14/182,574, filed on Feb. 18, 2014, and entitled "Packaged Semiconductor Devices and Methods of Packaging Semiconductor Devices" which claims priority to U.S. Provisional Application Ser. No. 61/914,264, filed on Dec. 10, 2013, entitled "Molding Mask Structure for Wafer Level Package," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9 and 16 illustrate cross-sectional views of a method of packaging semiconductor devices at various stages in accordance with some embodiments.

DETAILED DESCRIPTION

Figure 1:
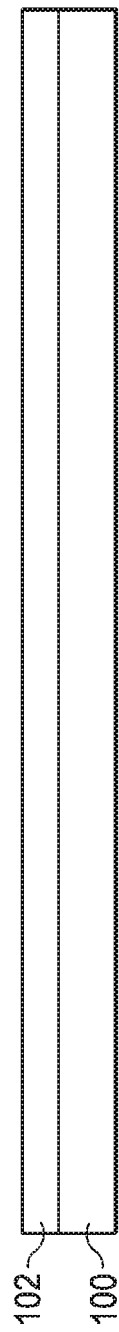

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel methods and structures for packaging semiconductor devices. Molding mask structures for wafer level packages and packaging methods are described herein. A novel mask coating is included in the packaged semiconductor devices. The mask coating is laminated on a temperate bond layer and increases fluidity of molding compound materials also included in the packaged semiconductor devices, eliminating or at least ameliorating void formation issues.

FIGS. 1 through 9 illustrate cross-sectional views of a method of packaging semiconductor devices at various stages in accordance with some embodiments. Referring first to FIG. 1, a carrier 100 is provided. The carrier 100 may comprise a wafer such as a semiconductor wafer, or the carrier 100 may comprise an organic substrate or other types of substrates. The carrier 100 comprises a sacrificial component that will be removed after one or more integrated circuit dies are packaged, such as integrated circuit dies 106 shown in FIG. 3, to be described further herein. The carrier 100 may later be cleaned and used to package other semiconductor devices, for example. Alternatively, the carrier 100 may be discarded after the packaging process.

A temperate bond layer 102 is formed on the carrier 100. The temperate bond layer 102 comprises a temporary bond layer that is coated on a top surface of the carrier 100 in some embodiments. The temperate bond layer 102 comprises about 1 µm to about 10 µm of a light to heat conversion (LTHC) material, for example. The temperate bond layer 102 may be formed using a deposition process, a spin coating process, or a printing process, as examples. Alternatively, the temperate bond layer 102 may comprise other materials, dimensions, and formation methods. In some embodiments, the temperate bond layer 102 is not included.

Figure 2:
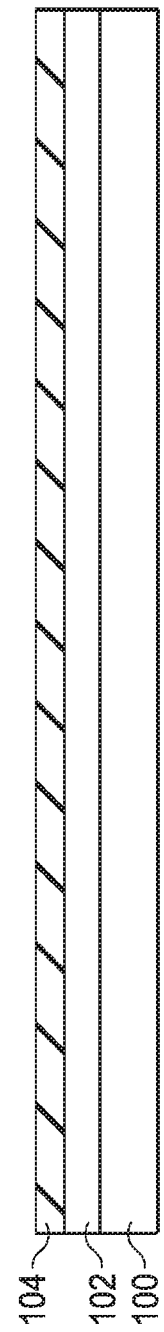

A mask coating 104 is formed over the carrier 100, e.g., over the temperate bond layer 102 disposed on the carrier 100, as shown in FIG. 2. The mask coating 104 may be formed using a deposition process, a spin coating process, or a printing process, as examples. In some embodiments, the mask coating 104 comprises a functional group of a material such as methylolpmpanel hmylate, 2-hydroxyethyl methacrylate, and/or combinations or multiple layers thereof, for example. In some embodiments, the mask coating 104 may include methylolpmpanel hmylate, i.e., CAS Registry Number: 15625-845 (CAS Registry Number is a Registered Trademark of the American Chemical Society), for example. In some embodiments, the mask coating 104 may include 2-hydroxyethyl methacrylate, i.e., CAS Registry Number: 868-77-9 (CAS Registry Number is a Registered Trademark of the American Chemical Society), for example. The mask coating 104 comprises a thickness of about 10 µm to about 40 µm in some embodiments. The mask coating 104 comprises a material that is curable at a temperature of about 100° C. to about 175° C. over a time period of about 1 hour to about 3 hours in some embodiments. Alternatively, the mask coating 104 may comprise other materials, dimensions, formation methods, and curing temperature and times.

An integrated circuit die 106 is coupled over the mask coating 104, as shown in FIG. 3. In some embodiments, a single integrated circuit die 106 is coupled over the mask coating 104 (not shown). In other embodiments, a plurality of integrated circuit dies 106 are coupled over the mask coating 104. Integrated circuit dies 106 may be packaged individually, or two or more integrated circuit dies 106 may be packaged together, in accordance with some embodiments of the present disclosure, for example.

Each of the integrated circuit dies 106 may include a workpiece 110. The workpiece 110 may include a semiconductor substrate comprising silicon or other semiconductor materials and may be covered by an insulating layer, for example. The workpiece 110 may also include other active components or circuits, not shown. The workpiece 110 may comprise silicon oxide over single-crystal silicon, for example. The workpiece 110 may conductive layers or semiconductor elements, e.g., transistors, diodes, etc. Compound semiconductors, GaAs, InP, Si/Ge, or SiC, as examples, may be used in place of silicon. The workpiece 110 may comprise a silicon-on-insulator (SOI) or a germanium-on-insulator (GOI) substrate, as examples.

The integrated circuit dies 106 may include a plurality of connectors such as contact pads 114 disposed on a surface thereof. The contact pads 114 may comprise Cu, Al, other metals, or alloys, combinations, or multiple layers thereof, for example. The contact pads 114 may be disposed within an insulating material 116 which may comprise silicon nitride, silicon dioxide, other insulators or polymers, or combinations or multiple layers thereof, for example. The contact pads 114 may be coupled to internal wiring of the integrated circuit dies 106, such as to vias and/or conductive lines in metallization layers or polysilicon layers of the integrated circuit dies 106, as examples, not shown.

In some embodiments, the integrated circuit dies 106 include a die attach film (DAF) 112 formed thereon. The DAF 112 may comprise a glue, an adhesive, or an adhesive film that is adapted to adhere the integrated circuit dies 106 to the mask coating 104 disposed over the carrier 100 in some embodiments, for example. The integrated circuit dies 106 may be attached over the carrier 100 (e.g., over the mask coating 104 disposed over the carrier 100) using a pick-and-place machine, other mechanism, or manually, for example.

The mask coating 104 comprises a mask that is interjacent the DAF 112 and the temperate bond layer 102 in some embodiments, for example. The mask coating 104 is disposed between the DAF 112 and the temperature bond layer 102 in some embodiments, for example.

A molding compound 120 is disposed around the integrated circuit dies 106 over the mask coating 104, as shown in FIG. 4. The molding compound 120 fills spaces between the dies 106 and encapsulates the dies 106, for example. The molding compound 120 comprises a molding material and may comprise epoxy, an organic polymer, or a polymer with or without a silica-based or glass filler added, as examples. In some embodiments, the molding compound 120 comprises a liquid molding compound (LMC) that is a gel type liquid when applied. Alternatively, the molding compound 120 may comprise other insulating materials. If the molding compound 120 extends over a top surface of contact pads 114 of the integrated circuit dies 106, the molding compound 120 is removed from over the contact pads 114 using a chemical-mechanical polish (CMP), etch process, or other methods in some embodiments, for example. The molding compound 120 is formed around the integrated circuit dies 106 in some embodiments.

An interconnect structure 122 is formed over the integrated circuit dies 106 and the molding compound 120, as shown in FIG. 5. The interconnect structure 122 includes a plurality of insulating material layers 124 and a plurality of conductive lines 126 and a plurality of conductive vias 128 formed within the insulating material layers 124. The insulating material layers 124 may comprise polybenzoxazole (PBO) or other insulators, and the conductive lines 126 and vias 128 may comprise Cu, Al, other metals, or alloys or multiple layers thereof, in some embodiments, as examples. The interconnect structure 122 is disposed over the integrated circuit dies 106 and the molding compound 120, for example. The interconnect structure 122 may include a plurality of contact pads 130 formed proximate a surface thereof. The contact pads 130 may comprise ball grid array (BGA) ball mounts in some embodiments, for example.

In some embodiments, the interconnect structure 122 may comprise a redistribution layer (RDL) or a post-passivation interconnect (PPI) structure, for example. In some embodiments, the interconnect structure 122 comprises horizontal electrical connections for the packaged semiconductor device (see packaged semiconductor device 140 shown in FIG. 9), for example. Alternatively, the interconnect structure 122 may comprise other types of electrical connection structures.

In some embodiments, a plurality of conductors 132 are coupled to the interconnect structure 122, as shown in FIG. 6. The plurality of conductors 132 are coupled to portions of the interconnect structure 122 in some embodiments, for example. The plurality of conductors 132 may be coupled to the contact pads 130 of the interconnect structure 122 in some embodiments, as shown in FIG. 6. The conductors 132 are formed over and are coupled to portions of the horizontal electrical connections of the interconnect structure 122 in some embodiments, for example.

The conductors 132 may comprise a eutectic material such as solder that is coupled to contact pads 130 or bond pads of the interconnect structure 122, for example. The conductors 132 may each comprise a solder bump or a solder ball, as examples. The conductors 132 may function as electrical connectors for the packaged semiconductor device. The eutectic material of the conductors 132 may be re-flowed to electrically and mechanically connect the packaged semiconductor device to another device or object, for example.

The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductors 132 such as solder balls may be formed from SnCu compounds as well, without the use of silver (Ag). Alternatively, lead-free solder connectors may include tin and silver, Sn—Ag, without the use of copper. The conductors 132 may be one among an array of the conductors 132 formed as a grid, referred to as a "ball grid array" or "BGA". The conductors 132 may alternatively be arranged in other shapes. The conductors 132 may also comprise non-spherical conductive connectors, for example. In some embodiments, the conductors 132 are not included.

The molding compound 120 is also referred to herein as a first molding compound 120. In some embodiments, a second molding compound 134 is disposed around the plurality of conductors 132, as shown in FIG. 6. The second molding compound 134 may comprise similar materials described for the first molding compound 120, for example. In some embodiments, the second molding compound 134 comprises an LMC. In some embodiments, the second molding compound 134 is not included.

Figure 7:
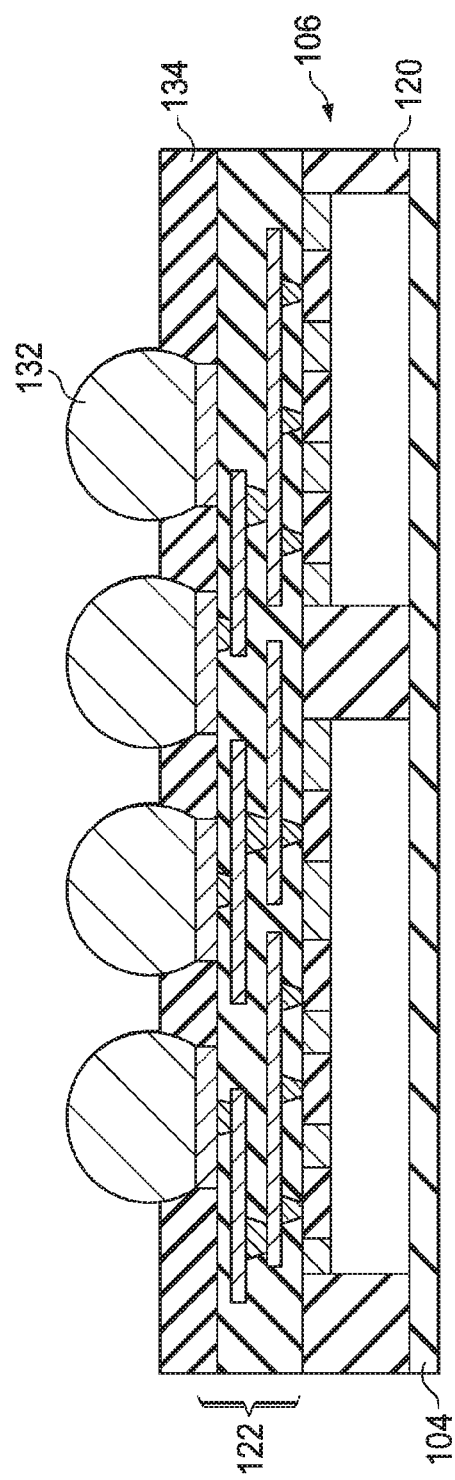

In some embodiments, the carrier 100 is then removed, as shown in FIG. 7. In some embodiments, the temperate bond layer 102 is also removed, also shown in FIG. 7. The back side of the packaged semiconductor device may be thinned using a CMP or grinding process to remove the temperate bond layer 102 in some embodiments, for example. The temperate bond layer 102 may be removed using an etch process in some embodiments. In other embodiments, the temperate bond layer 102 may be left remaining in the structure.

Figure 16:
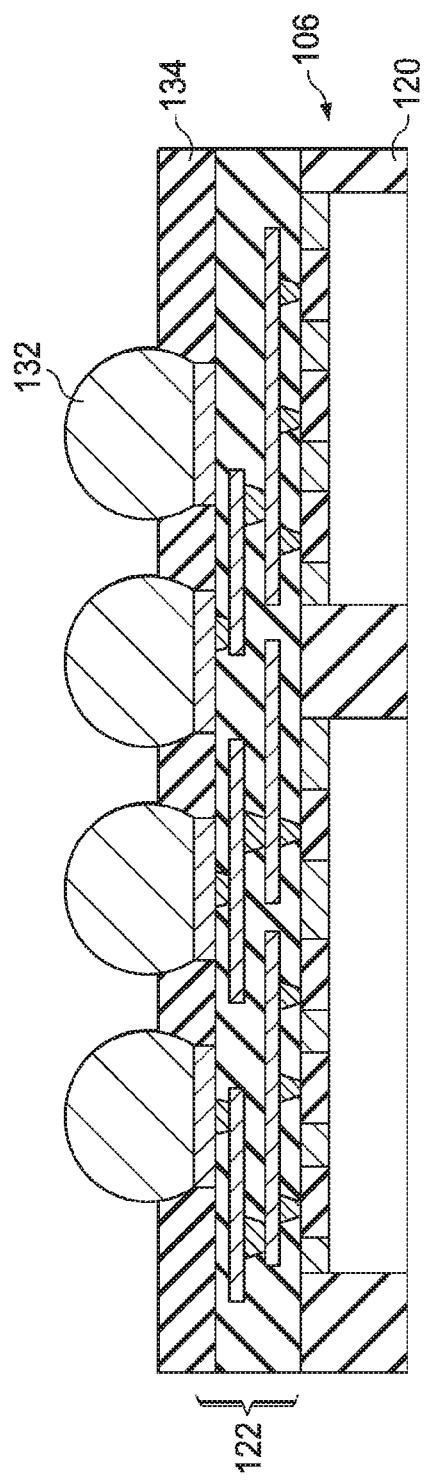

In some embodiments, the mask coating 104 may also be removed. In other embodiments, the mask coating 104 is left remaining in the structure. The mask coating 104 may be removed when the temperate bond layer is removed or using an additional process step, for example. FIG. 16 illustrates an embodiment wherein mask coating 104 is removed.

Figure 8:
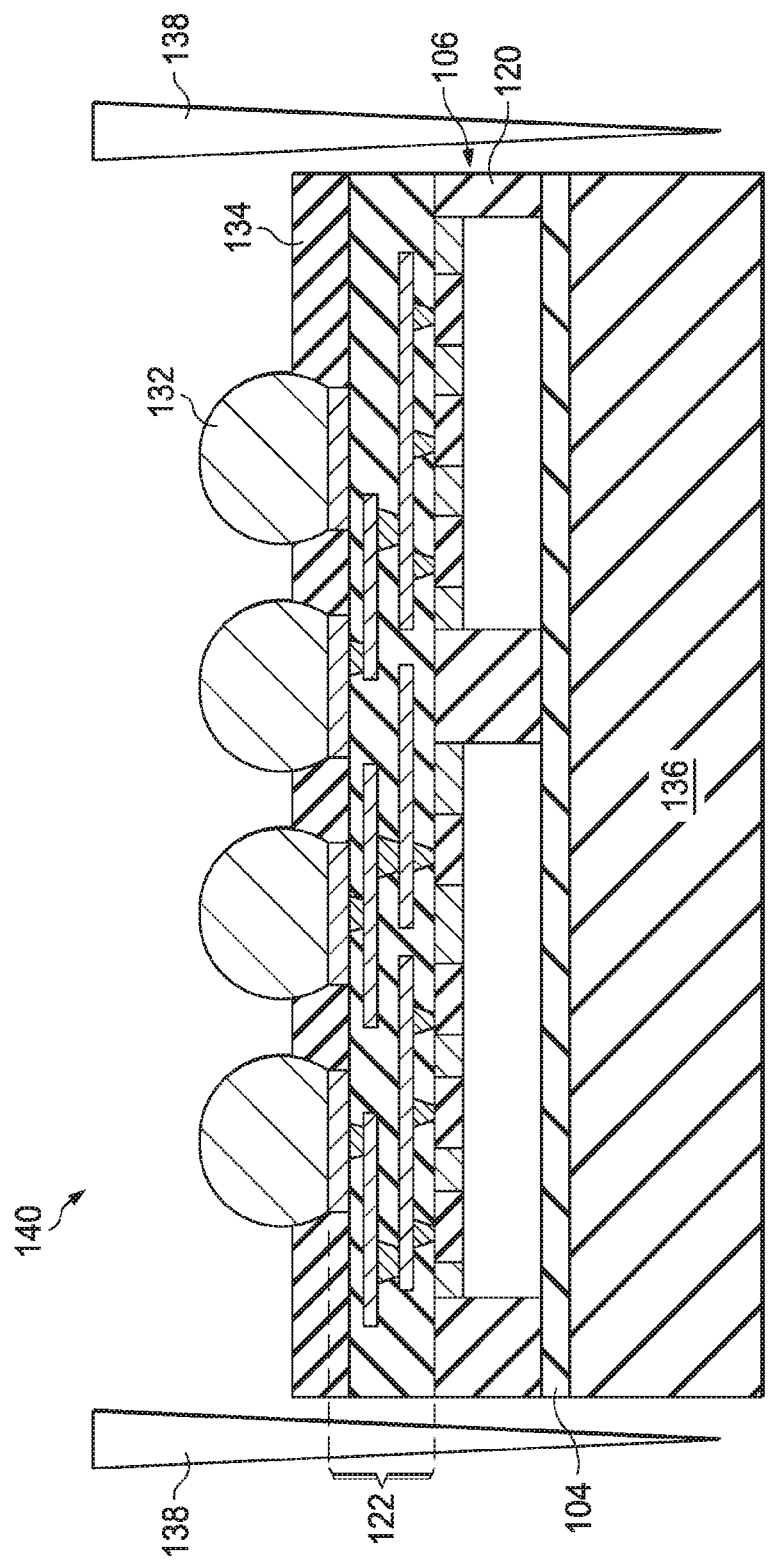

Next, the interconnect structure 122, the molding compounds 120 and 134, and the mask coating 104 are singulated using a die saw 138, laser, or other device to form a plurality of packaged semiconductor devices 140, each of the plurality of packaged semiconductor devices 140 including at least one of the plurality of integrated circuit dies 106, as shown in FIG. 8. In some embodiments, the packaged semiconductor devices 140 may be attached to a dicing tape 136 before the singulation process, also shown in FIG. 8. The dicing tape 136 is then removed, leaving the packaged semiconductor device 140 shown in FIG. 9.

The packaged semiconductor device 140 includes at least one integrated circuit die 106. In some embodiments, the packaged semiconductor device 140 includes two or more integrated circuit dies 106, for example. The integrated circuit dies 106 packaged together in the packaged semiconductor device 140 may comprise similar, the same, or different functions, for example. The molding compound 120 is disposed around the integrated circuit die or dies 106, and the mask coating 104 is disposed over a first side of the integrated circuit die or dies 106 and the molding compound 120 (e.g., the top side in the view shown in FIG. 9). The interconnect structure 122 is disposed over a second side of the integrated circuit die or dies 106 and the molding compound 120 (e.g., the bottom side in the view shown in FIG. 9). The second side is opposite the first side of the integrated circuit die or dies 106 and the molding compound 120.

Figure 9:
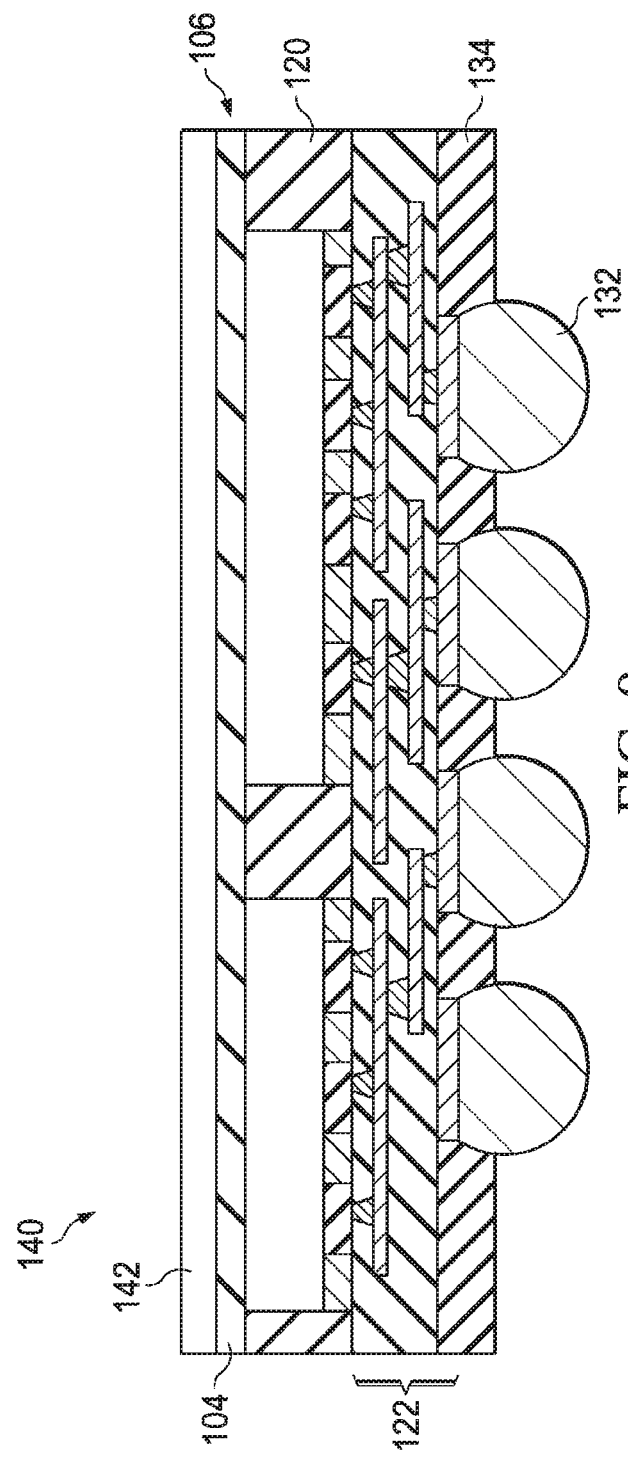

In some embodiments, a lid, a heat spreader, or a backside protective film 142 is disposed over the mask coating 104, as shown in FIG. 9. The lid, heat spreader, or backside protective film 142 may be disposed over the molding compound 120 and the integrated circuit dies 106 in embodiments wherein the mask coating 104 is removed, as another example. The lid or heat spreader 142 may comprise copper or aluminum comprising a thickness of about 100 µm to about 500 µm, as examples. The protective film 142 may comprise about 10 µm to about 100 µm of epoxy or a polymer, as examples. The lid, heat spreader, or backside protective film 142 may be attached using an adhesive or formed using a deposition or coating process, for example. Alternatively, a lid, heat spreader, or backside protective film 142 may not be included.

Figure 10:
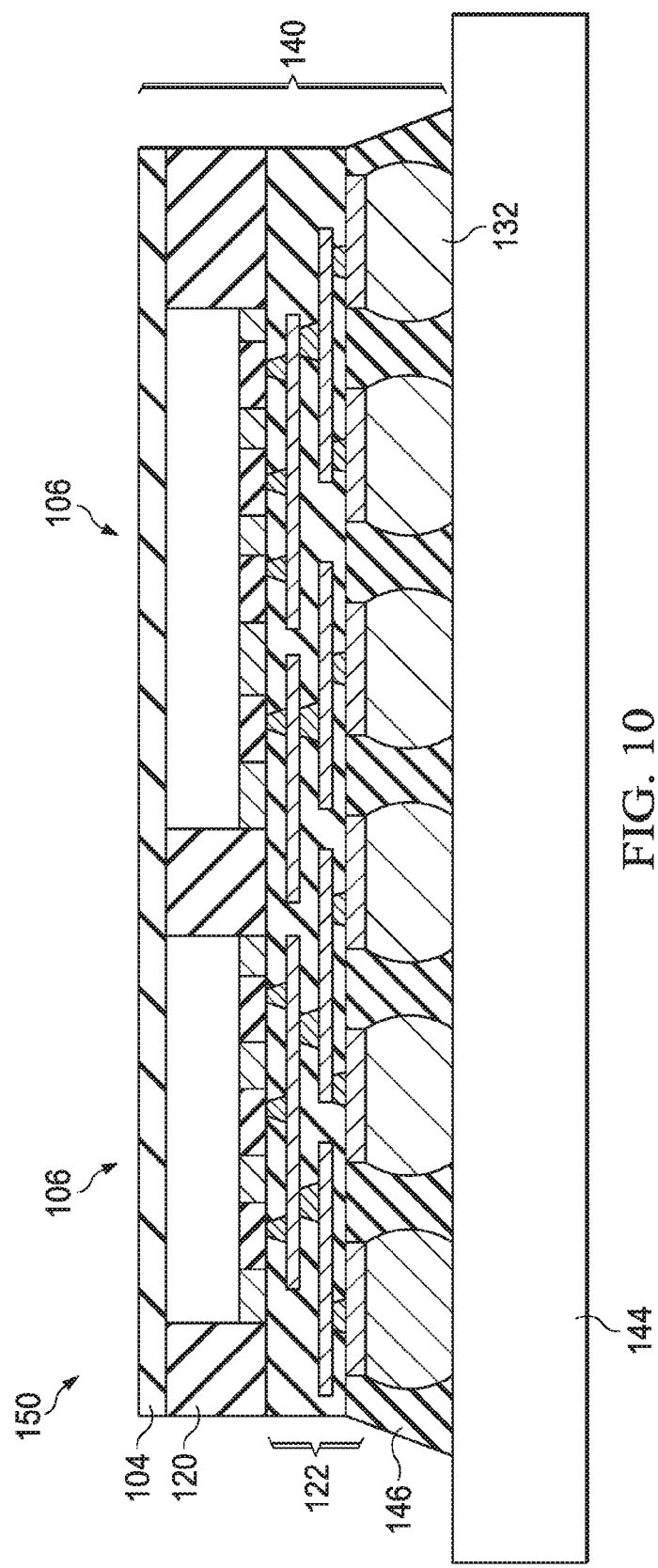
FIG. 10 is a cross-sectional view illustrating a packaged semiconductor device in accordance with some embodiments.

In some embodiments, the plurality of conductors 132 are coupled to a substrate 144, as shown in FIG. 10. The substrate 144 may comprise a printed circuit board (PCB) in some embodiments. Alternatively, the substrate 144 may comprise other materials, such as an interposer, another integrated circuit die, or other objects, as example. In some embodiments, the second molding compound 134 is not included, also illustrated in FIG. 10. The packaged semiconductor device 150 includes the packaged semiconductor device 140 that is coupled to the substrate 144.

In some embodiments, an underfill material 146 may be disposed between the plurality of conductors 132 and between the substrate 144 and the interconnect structure 122, also illustrated in FIG. 10. The underfill material 146 may comprise an epoxy material, an organic polymer, or other materials. The underfill material 146 may include a filler such as silica, aluminum oxide, or other filler materials, as example. The underfill material 146 may be applied using a needle along one or more sides of the packaged semiconductor device 150 or through an aperture formed within the molding compound 120, interconnect structure 122, and mask coating 104, for example, not shown.

Figure 11:
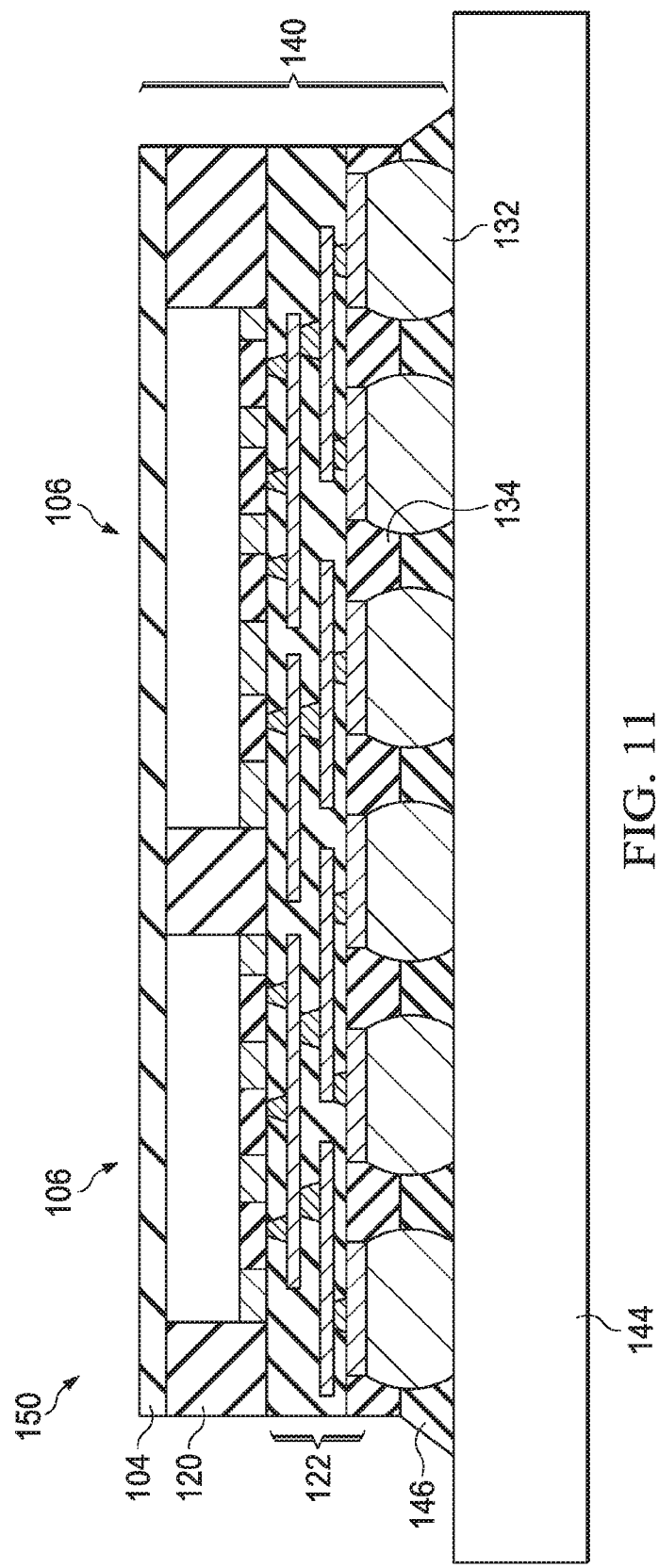
FIG. 11 is a cross-sectional view illustrating a packaged semiconductor device in accordance with other embodiments.

In some embodiments, the second molding compound 134 is included, and an underfill material 146 is also included in the packaged semiconductor device 150, as shown in FIG. 11. The second molding compound 134 may be disposed between the plurality of conductors 132 and between the underfill material 146 and the interconnect structure 122, for example.

Figure 12:
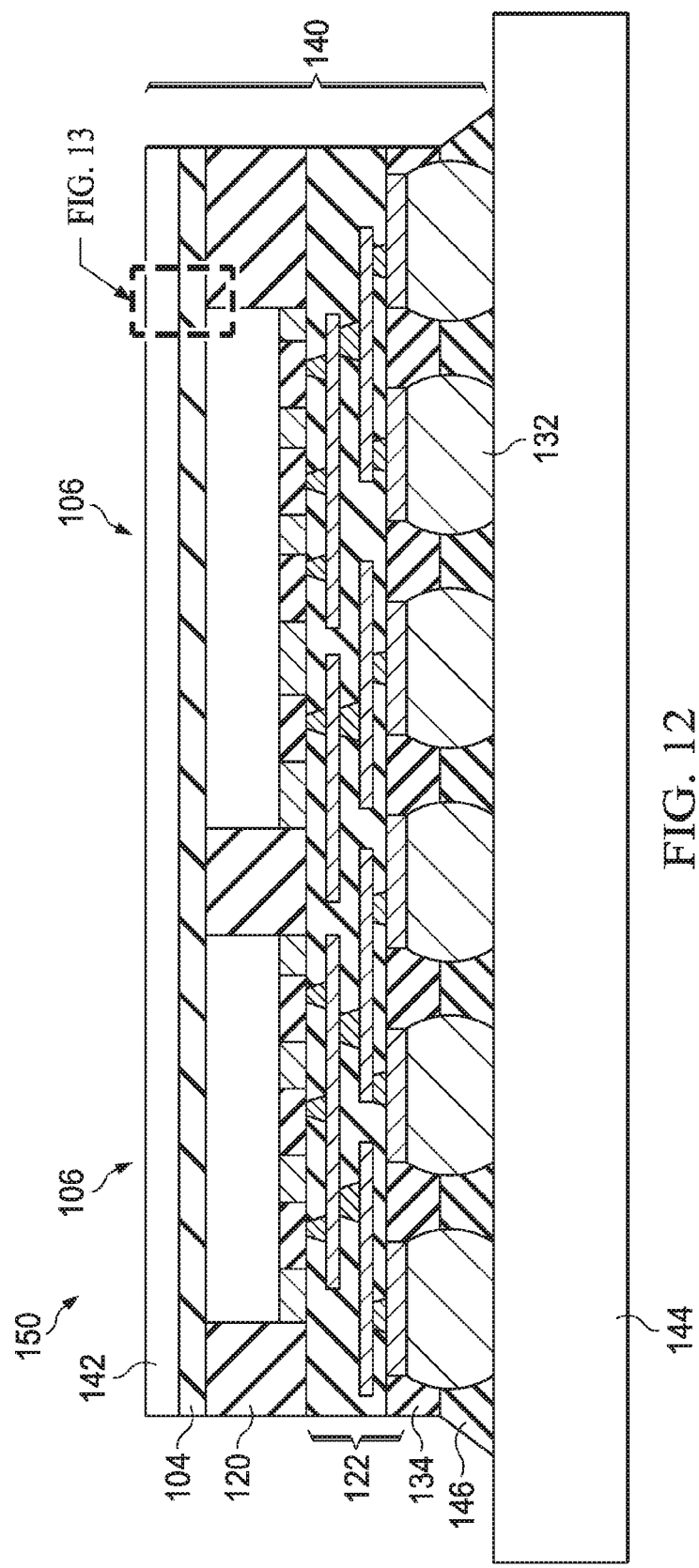
FIG. 12 is a cross-sectional view illustrating a packaged semiconductor device in accordance with some embodiments.
Figure 13:
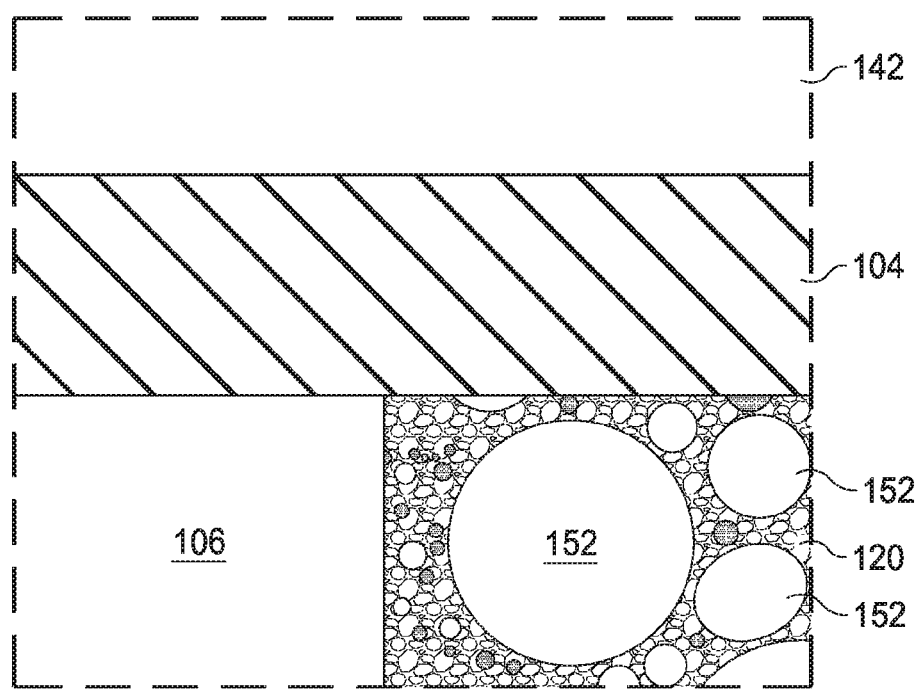
FIG. 13 is a more detailed view of a portion of the packaged semiconductor device shown in FIG. 12 in accordance with some embodiments.

FIG. 12 is a cross-sectional view illustrating a packaged semiconductor device 150 in accordance with some embodiments, wherein the lid, heat spreader, or backside protective film 142 is included and wherein the conductors 132 are coupled to a substrate 144. Advantageously, because of the inclusion of the mask coating 104, the application of the molding compound 120 is improved, as shown in a more detailed view in FIG. 13, which is a more detailed view of a portion of the packaged semiconductor device 150 shown in FIG. 12 in accordance with some embodiments. In some embodiments, the molding compound 120 includes a filler comprising glass spheres 152. Advantageously, grinding processes used in the packaging processes are prevented from deleteriously affecting the filler materials of the molding compound 120, because of the inclusion of the mask coating 104 in accordance with some embodiments of the present disclosure, for example.

Figure 14:
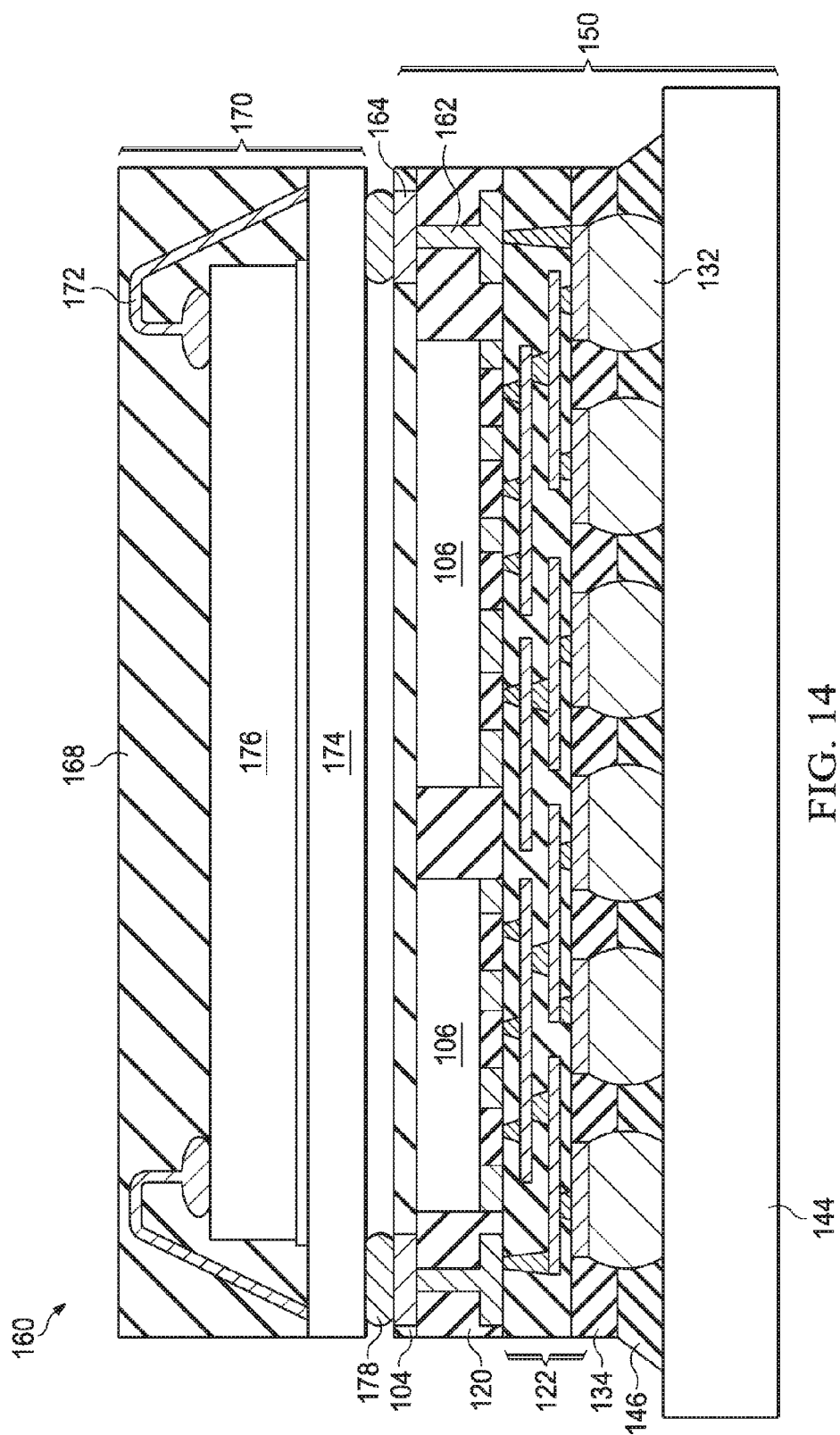
FIG. 14 is a cross-sectional view illustrating a packaged semiconductor device in accordance with some embodiments.

FIG. 14 is a cross-sectional view illustrating a packaged semiconductor device 160 in accordance with some embodiments. The packaged semiconductor device 160 comprises a package-on-a package (PoP) device in accordance with some embodiments. The PoP device 160 includes a packaged semiconductor device 150 described herein that is coupled to a packaged semiconductor device 170. The packaged semiconductor device 150 comprises a first packaged semiconductor device, and the packaged semiconductor device 170 comprises a second packaged semiconductor device that is coupled to the packaged semiconductor device 150 in accordance with some embodiments, for example.

The packaged semiconductor device 150 includes a plurality of through-vias 162 formed within the molding compound 120. The through-vias 162 provide vertical connections for the packaged semiconductor device 150. Contact pads 164 are coupled to the through-vias 162. The contact pads 164 may be formed over or within the mask coating 104, as illustrated in FIG. 14. The contact pads 164 of the packaged semiconductor device 150 are coupled to contact pads (not shown) of packaged semiconductor device 170 by conductors 178 which may comprise solder balls or other materials (similar to the materials described for conductors 132).

Packaged semiconductor device 170 includes one or more integrated circuit dies 176 coupled to a substrate 174. Wire bonds 172 may be coupled to contact pads on a top surface of the integrated circuit die or dies 176, which are coupled to bond pads (not shown) on the substrate 174. A molding compound 168 may be disposed over the wire bonds 172, integrated circuit die or dies 176, and the substrate 174.

Alternatively, a PoP device 160 may include two packaged semiconductor devices 150 described herein that are coupled together in some embodiments, not shown in the drawings. In some embodiments, the PoP device 160 may comprise a system-on-a-chip (SOC) device, as another example.

Figure 15:
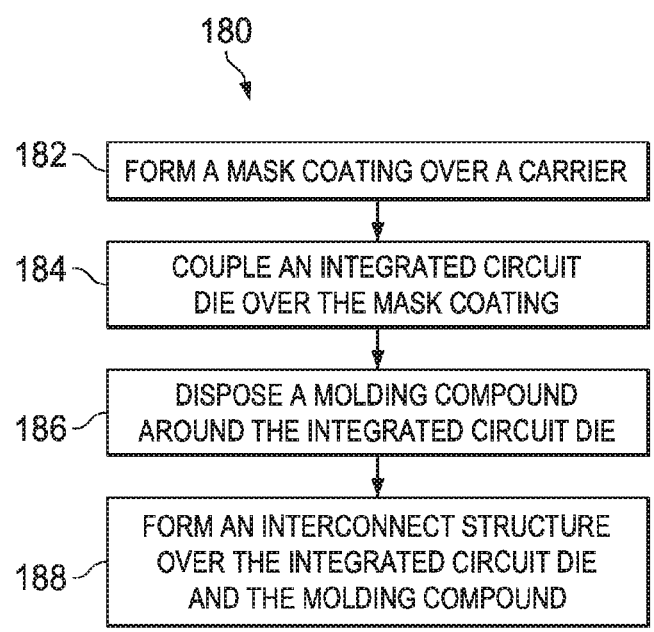
FIG. 15 is a flow chart of a method of packaging semiconductor devices in accordance with some embodiments.

FIG. 15 is a flow chart 180 of a method of packaging semiconductor devices in accordance with some embodiments. In step 182, a mask coating 104 (see also FIG. 2) is formed over a carrier 100. In step 184, an integrated circuit die 106 is coupled over the mask coating 104 (FIG. 3). In step 186, a molding compound 120 is disposed around the integrated circuit die 106 (FIG. 4). In step 188, an interconnect structure 122 is formed over the integrated circuit die 106 and the molding compound 120 (FIG. 5).

Advantages of some embodiments of the present disclosure include providing a novel mask coating 104 that decreases friction force between molding compound 120 materials and a carrier 100. The molding compound 120 flows more smoothly when applied, eliminating or at least ameliorating void formation issues in the molding compound 120, in some embodiments. Increased packaging yields are achievable by implementing embodiments of the present disclosure. Furthermore, the novel packaged semiconductor devices and methods are easily implementable into packaging process flows.

In some embodiments, a method of packaging a semiconductor device includes forming a mask coating over a carrier, coupling an integrated circuit die over the mask coating, and disposing a molding compound around the integrated circuit die. The method includes forming an interconnect structure over the integrated circuit die and the molding compound.

In other embodiments, a method of packaging semiconductor devices includes forming a temperate bond layer over a carrier, forming a mask coating over the temperate bond layer, and coupling a plurality of integrated circuit dies over the mask coating. The method includes disposing a molding compound around the plurality of integrated circuit dies, forming an interconnect structure over the plurality of integrated circuit dies and the molding compound, and removing the carrier.

In yet other embodiments, a packaged semiconductor device includes an integrated circuit die, a molding compound disposed around the integrated circuit die, and a mask coating disposed over a first side of the integrated circuit die and the molding compound. An interconnect structure is disposed over a second side of the integrated circuit die and the molding compound, wherein the second side is opposite the first side.

In some aspects, embodiments described herein may provide for a packaged semiconductor device, comprising an integrated circuit die, and a molding compound disposed around the integrated circuit die. The packaged semiconductor device also includes a mask coating disposed over a first side of the integrated circuit die and the molding compound, and an interconnect structure disposed over a second side of the integrated circuit die and the molding compound, wherein the second side is opposite the first side.

In other aspects, embodiments described herein may provide for a package-on-package (PoP) device, comprising a mask coating, and one or more integrated circuit (IC) dies on the mask coating. The PoP device further includes a first molding compound at least partially encapsulating the one or more IC dies and contacting the mask coating, an interconnect structure over the one or more IC dies and the first molding compound, and a second semiconductor device coupled to a plurality of contact pads disposed over or within the mask coating of the first semiconductor device.

In yet other aspects, embodiments described herein may provide for a device, comprising an integrated circuit (IC) die at least partially encapsulated by a molding compound, a mask coating overlying a first side of the IC die and the molding compound, wherein the mask coating comprises a functional group of a material selected from the group consisting essentially of methylolpmpanel hmylate, 2-hydroxyethyl methacrylate, and combinations thereof. The device further includes an interconnect structure electrically connected to contact pads on a second side of the IC die, the second side being opposite the first side, and a connector structure electrically connected to the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A packaged semiconductor device, comprising:
   an integrated circuit die;
   an adhesive film on a first side of the integrated circuit die;
   a molding compound disposed around the integrated circuit die;

a mask coating disposed over the first side of the integrated circuit die and the molding compound, the mask coating being in physically contact with the adhesive film; and an interconnect structure disposed over a second side of the integrated circuit die and the molding compound, wherein the second side is opposite the first side.

2. The packaged semiconductor device according to claim 1, wherein the mask coating comprises a functional group of a material selected from the group consisting essentially of methylolpmpanel hmylate, 2-hydroxyethyl methacrylate, and combinations thereof.

3. The packaged semiconductor device according to claim 1, wherein the mask coating comprises a thickness of about 10 µm to about 40 µm.

4. The packaged semiconductor device according to claim 1, wherein the mask coating comprises a material that is curable at a temperature of about 100° C. to about 175° C. over a time period of about 1 hour to about 3 hours.

5. The packaged semiconductor device according to claim 1, further comprising:
a plurality of conductors coupled to portions of the interconnect structure.

6. The packaged semiconductor device according to claim 5, wherein the plurality of conductors are coupled to a substrate.

7. The packaged semiconductor device according to claim 6, further comprising an underfill material disposed between the plurality of conductors and between the substrate and the interconnect structure.

8. The packaged semiconductor device according to claim 7, wherein the molding compound comprises a first molding compound, and wherein the packaged semiconductor device further comprises a second molding compound disposed between the plurality of conductors and between the underfill material and the interconnect structure.

9. The packaged semiconductor device according to claim 7, further comprising a lid, a heat spreader, or a backside protective film disposed over the mask coating.

10. A package-on-package (PoP) device including the packaged semiconductor device according to claim 7, wherein the packaged semiconductor device comprises a first packaged semiconductor device, and further comprising a second packaged semiconductor device coupled to the first packaged semiconductor device.

11. A package-on-package (PoP) device, comprising:
a mask coating;
one or more integrated circuit (IC) dies on the mask coating;
an adhesive film interposed between the mask coating and the one or more IC dies;
a first molding compound at least partially encapsulating the one or more IC dies and contacting the mask coating;
an interconnect structure over the one or more IC dies and the first molding compound; and
a second semiconductor device coupled to a plurality of contact pads disposed over or within the mask coating.

12. The PoP device of claim 11, wherein the mask coating comprises a functional group of a material selected from the group consisting essentially of methylolpmpanel hmylate, 2-hydroxyethyl methacrylate, and combinations thereof.

13. The PoP device of claim 11, wherein the mask coating comprises a thickness of about 10 µm to about 40 µm.

14. The PoP device of claim 11, wherein the mask coating comprises a material that is curable at a temperature of about 100° C. to about 175° C. over a time period of about 1 hour to about 3 hours.

15. The PoP device of claim 11, further comprising:
a plurality of conductors connected to the interconnect structure and to a substrate; and
an underfill material disposed between the plurality of conductors and between the substrate and the interconnect structure.

16. The PoP device of claim 15, further comprising a second molding compound disposed between the underfill material and the interconnect structure.

17. The PoP device of claim 16, wherein the first molding compound and the second molding compound have outermost sidewalls that are coterminous.

18. The PoP device of claim 11, wherein the one or more integrated circuit (IC) dies on the mask coating comprises two IC dies adjacent one another on the mask coating.

19. A device, comprising:
an integrated circuit (IC) die at least partially encapsulated by a molding compound;
an adhesive film on a first side of the IC die;
a mask coating overlying the first side of the IC die and the molding compound, wherein the mask coating is in physical contact with the adhesive film, wherein the mask coating comprises a functional group of a material selected from the group consisting essentially of methylolpmpanel hmylate, 2-hydroxyethyl methacrylate, and combinations thereof;
an interconnect structure electrically connected to contact pads on a second side of the IC die, the second side being opposite the first side; and
a connector structure electrically connected to the interconnect structure.

20. The device of claim 19, further comprising a second IC die at least partially encapsulated by the molding compound, wherein the mask coating overlies a first side of the second IC die.

* * * * *